(12) United States Patent
Ling et al.

(10) Patent No.: US 9,559,273 B2
(45) Date of Patent: Jan. 31, 2017

(54) LIGHT-EMITTING PACKAGE STRUCTURE AND METHOD OF FABRICATING THE SAME

(71) Applicant: ACHROLUX INC., Sunnyvale, CA (US)

(72) Inventors: Peiching Ling, Sunnyvale, CA (US); DeZhong Liu, Sunnyvale, CA (US)

(73) Assignee: ACHROLUX INC., Sunnyvale, CA (US)

( * ) Notice: Subject to any disclaimer, the term of this patent is extended or adjusted under 35 U.S.C. 154(b) by 111 days.

(21) Appl. No.: 14/094,063

(22) Filed: Dec. 2, 2013

(65) Prior Publication Data

US 2015/0155461 A1 Jun. 4, 2015

(51) Int. Cl.
| | |
|---|---|
| H01L 33/64 | (2010.01) |
| H01L 33/54 | (2010.01) |
| H01L 33/56 | (2010.01) |
| H01L 33/36 | (2010.01) |
| H01L 33/50 | (2010.01) |
| H01L 33/00 | (2010.01) |

(52) U.S. Cl.
CPC ........... *H01L 33/54* (2013.01); *H01L 33/0095* (2013.01); *H01L 33/50* (2013.01); *H01L 2933/005* (2013.01); *H01L 2933/0041* (2013.01)

(58) Field of Classification Search
CPC ...... H01L 33/644; H01L 33/36; H01L 33/507; H01L 33/56; H01L 33/54
See application file for complete search history.

(56) References Cited

U.S. PATENT DOCUMENTS

| | | | | |
|---|---|---|---|---|
| 8,455,907 | B2 * | 6/2013 | Waragawa et al. | 257/98 |
| 8,536,592 | B2 * | 9/2013 | Chang et al. | 257/88 |
| 8,937,318 | B2 * | 1/2015 | Wada | H01L 24/32 |
| | | | | 257/76 |

\* cited by examiner

*Primary Examiner* — Robert Carpenter
(74) *Attorney, Agent, or Firm* — Amin, Turocy & Watson, LLP

(57) ABSTRACT

A light-emitting package structure is provided, including an encapsulant, an light-emitting component embedded the encapsulant and having a light-emitting side and a non-emitting side opposing the light-emitting side, a dam embedded and exposed from the encapsulant, and a phosphor layer covering the light-emitting side and the dam. The non-emitting side has a plurality of electrodes. Since the heat generated by the phosphor layer can be transmitted to an outside region of the light-emitting package structure through the dam, the etiolation of the encapsulant can thus be prevented. A method of fabricating the light-emitting package structure is also provided.

14 Claims, 5 Drawing Sheets

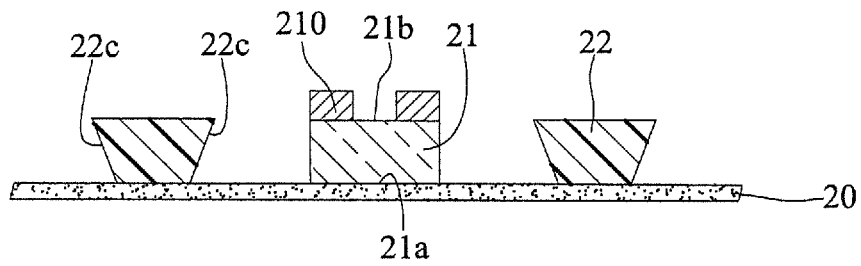
FIG. 2A
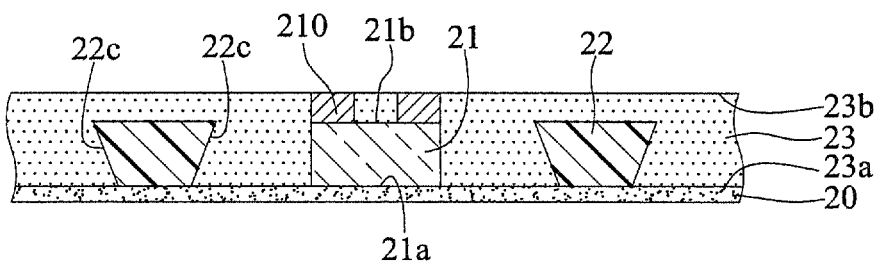
FIG. 2B
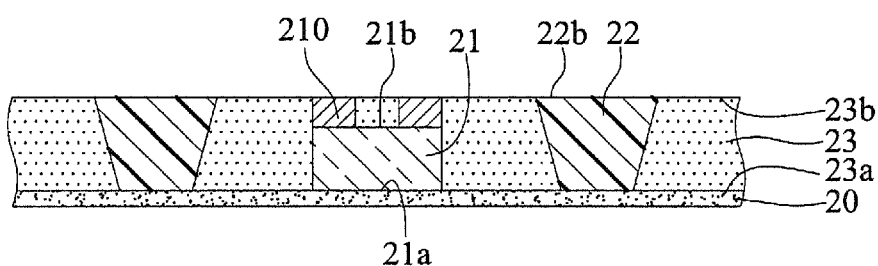
FIG. 2C
FIG. 2C'
FIG. 2C''

LIGHT-EMITTING PACKAGE STRUCTURE AND METHOD OF FABRICATING THE SAME

BACKGROUND OF THE INVENTION

1. Field of the Invention

The present invention relates to semiconductor packages, and, more particularly, to a light-emitting package.

2. Description of Related Art

With the booming development in the electronic industry, electronic products gradually become compact in form, and the research for the functionality pursuits for high performance, high functionality, and high processing speed. Light-emitting diodes (LEDs) are variously employed in electronic products that require lighting due to their advantages of long lifecycle, small volume, high shock resistance, and low power consumption. Therefore, the application of LEDs becomes popular in industry, various electronic products, and appliances.

FIG. 1A is a sectional view of an LED package 1 according to the prior art. The LED package 1 has a substrate 10, a reflection cup 11 formed on the substrate 10 and having an opening 110, and an LED component 12 disposed in the opening 110 and electrically connected to the substrate 110 by a plurality of wires 120. A phosphor powder layer 130 is attached to the surface of the LED component 12, and then the LED component 12 is covered by an encapsulant 13.

However, in the LED package 1 of the prior art, since the phosphor powder layer 130 is close to the LED component 12, the phosphor powder layer 130 will be heated up and the light-emitting efficiency of the LED component 12 is affected.

FIG. 1B is a sectional view of another LED package 1' according to the prior art. In the LED package 1', the phosphor powder layer 130 is attached to the encapsulant 13, such that the phosphor powder layer 130 is away from the LED component 12. Therefore, the light-emitting efficiency is not affected.

However, in the LED package 1' of the prior art, since the phosphor powder layer 130 is away from the LED component 12, the heat accumulated on the phosphor powder layer 130 cannot be dissipated to a region outside the LED package 1'.

Therefore, how to overcome the problems in the prior art is an issue desired to be solved.

SUMMARY OF THE INVENTION

According to the above drawbacks of the prior art, the present invention provides a light-emitting package structure, including an encapsulant having a first surface and a second surface opposing the first surface; at least one light-emitting component embedded the encapsulant, wherein the light-emitting component has a light-emitting side exposed from the first surface of the encapsulant and a non-emitting side opposing the light-emitting side and positioned at the same side with the second surface of the encapsulant, and the non-emitting side has a plurality of electrodes; at least one dam embedded the encapsulant and exposed from the first surface of the encapsulant; and a phosphor layer formed on the first surface of the encapsulant and the dam to cover the light-emitting side of the light-emitting component.

The present invention further provides a method of fabricating a package structure, comprising: coupling at least one light-emitting component and at least one dam on a carrier, the light-emitting component having an light-emitting side coupled to the carrier and a non-emitting side opposing the light-emitting side, wherein the non-emitting side has a plurality of electrodes; forming on the carrier an encapsulant that encapsulates the light-emitting component and the dam, the encapsulant having a first surface coupled to the carrier and a second surface opposing the first surface, such that the non-emitting side of the light-emitting component is positioned at the same side with the second surface of the encapsulant; removing the carrier and exposing the light-emitting side of the light-emitting component and the dam from the first surface of the encapsulant; and forming on the first surface of the encapsulant and the dam a phosphor layer that covers the light-emitting side of the light-emitting component.

The light-emitting package structure and method of fabricating the same according to the present invention are achieved by forming the phosphor layer on the first surface of the encapsulant, such that the heat produced by the phosphor layer is transmitted to the outside, thereby preventing the etiolation of silicone (or the encapsulant layer). Since the phosphor layer does not encapsulate the light-emitting component, the heat fade issue caused by the heat of the light-emitting component can be avoided, so as to improve the emitting efficiency.

Moreover, the non-emitting side of the light-emitting component has electrodes, which can also directly exhaust the heat to improve the emitting efficiency.

BRIEF DESCRIPTION OF DRAWINGS

FIGS. 2A-2H are schematic sectional views illustrating a method of fabricating a light-emitting package structure of an embodiment according to the present invention, wherein FIG. 2E is a schematic bottom view;

FIGS. 2C' and 2C" show different embodiments of FIG. 2C;

FIG. 2G' is a different embodiment of FIG. 2G; and

DETAILED DESCRIPTION OF THE INVENTION

Figure 1A:
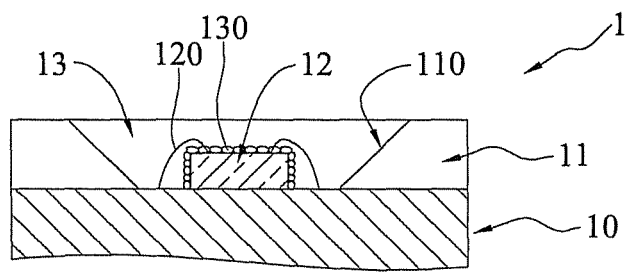
FIG. 1A is a sectional view of a light-emitting package according to the prior art.
Figure 1B:
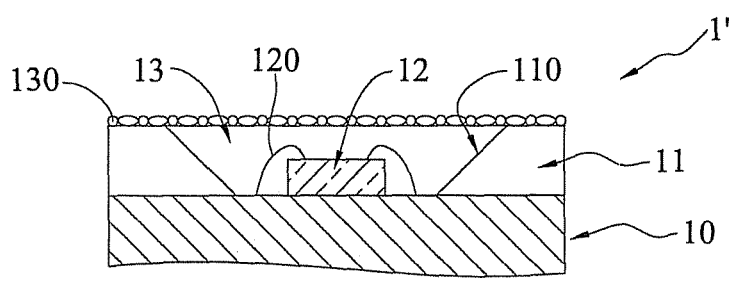
FIG. 1B is a sectional view of another light-emitting package according to the prior art.

The following illustrative embodiments are provided to illustrate the disclosure of the present invention, these and other advantages and effects can be apparently understood by those in the art after reading the disclosure of this specification.

It should be advised that the structure, ratio, and size as illustrated in this context are only used for disclosures of this specification, provided for persons skilled in the art to understand and read, and technically do not have substantial meaning. Any modification of the structure, change of the ratio relation, or adjustment of the size should be involved in the scope of disclosures in this specification without influencing the producible efficacy and the achievable objective of this specification. Also, the referred terms such as "on", "under", "bottom", "first", "second" and "one" in this specification are only for the convenience to describe, not for limiting the scope of embodiment in the present invention. Those changes or adjustments of relative relationship without substantial change of technical content should also be considered within the category of implementation.

FIGS. 2A-2H are schematic sectional views illustrating a method of fabricating a light-emitting package structure 2 of an embodiment according to the present invention.

As shown in FIG. 2A, a light-emitting component 21 having a plurality of electrodes 210 is provided.

In an embodiment, the light-emitting component 21 is a light-emitting diode (LED), which has an light-emitting side 21a and a non-emitting side 21b opposing the light-emitting side, and the electrodes 210 are disposed on the non-emitting side 21b.

As shown in FIG. 2B, the light-emitting components 21 and the light-emitting sides 21a thereof are coupled to a carried 20, and a plurality of dams 22 are coupled to the carrier 20.

In an embodiment, since the manufacturing process of the periphery of the respective light-emitting components 21 are the same, only one of the light-emitting component 21 is illustrated for the convenience of explanation.

Moreover, there are various types of carrier 20, including a release film or the like, which is not specifically limited.

Further, the dam 22 is a circuit board, a lead frame, or a conductor. If the dam 22 is a lead frame, an electrical isolation is required for the lateral surface 22c thereof.

In addition, the section of the dam 22 presents a pattern with a wider top portion and a narrower bottom portion. For example, the section gradually narrows in the direction toward the carrier 20 such that the lateral surface 22c of the dam 22 serves as a light-reflecting surface provided to reflect the light emitted from the light-emitting component 21.

As shown in FIG. 2C, an encapsulant 23 is formed on the carrier 20 and encapsulates the light-emitting component 21 and the dam 22. The encapsulant 23 has a first surface 23a coupled to the carrier 20 and a second surface 23b opposing the first surface 23a. The non-emitting side 21b of the light-emitting component 21 is positioned at the same side with the second surface 23b of the encapsulant 23.

In an embodiment, the electrodes 210 of the light-emitting component 21 are exposed from the second surface 23b of the encapsulant 23. For example, the electrodes 210 of the light-emitting component 21 are flush with the second surface 23b of the encapsulant 23, and the dam 22 is not exposed from the second surface 23b of the encapsulant 23.

Moreover, the encapsulant 23 is silicone such as clear silicone. Generally, glue material may remain on the electrodes 210 of the light-emitting component 21, and the remained glue material should be removed.

In another embodiments, the dam 22 is exposed from the second surface 23b of the encapsulant 23, as shown in FIG. 2C', in which the top surface of the dam (i.e., an outer junction side 22b) is flush with the second surface 23b of the encapsulant 23. Alternately, as shown in FIG. 2C'', both the electrodes 210 of the light-emitting component 21 and the dam 22 are not exposed from the second surface 23b of the encapsulant 23. In this case, the encapsulant 23 is preferably to use white silicone, so as to reflect the light emitted from the light-emitting component 21.

Figure 3A:
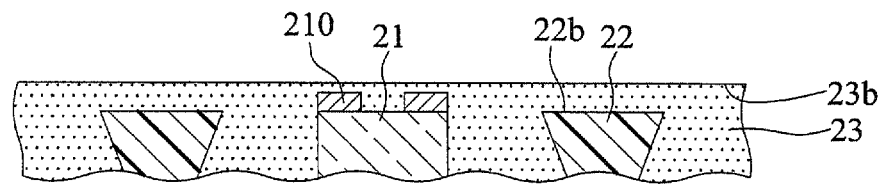
FIGS. 3A-3C are schematic sectional views illustrating a method of fabricating a light-emitting package structure of another embodiment according to the present invention.
Figure 3B:
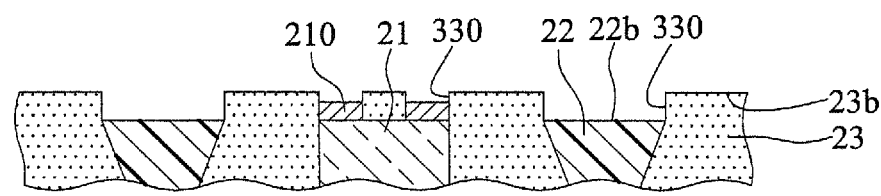

In addition, the above-mentioned exposing method may also perform opening a hole on the second surface 23b of the encapsulant 23 to expose the electrodes 210 of the light-emitting component 21 or the dam, as shown in FIG. 3B.

Figure 2D:
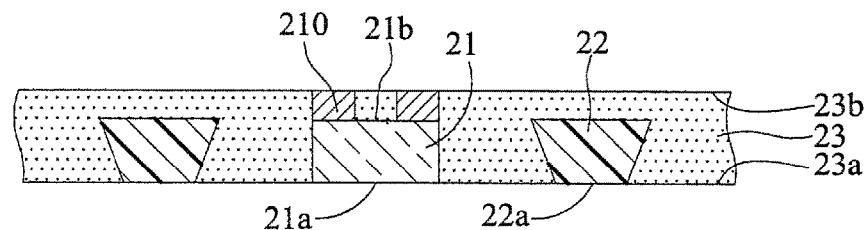

As shown in FIG. 2D, the carrier 20 is removed to allow the light-emitting side 21a of the light-emitting component 21 and the bottom side 22a of the dam 22 to be exposed from the first surface 23a of the encapsulant 23.

Figure 2E:
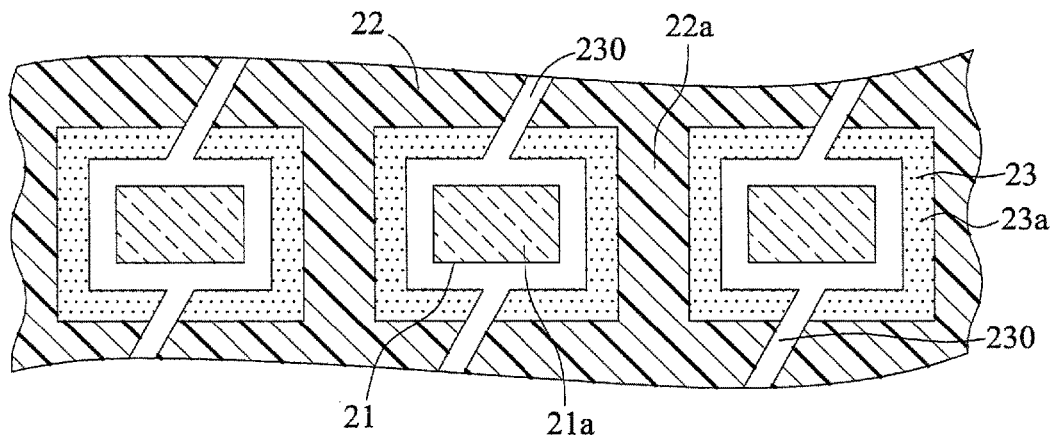

As shown in FIG. 2E, a trench 230 is optionally formed on the first surface 23a of the encapsulant 23 and the bottom side 22a of the dam 22. For the convenience of illustration, a plurality of the light-emitting components 21 are shown in FIG. 2E.

Figure 2F:
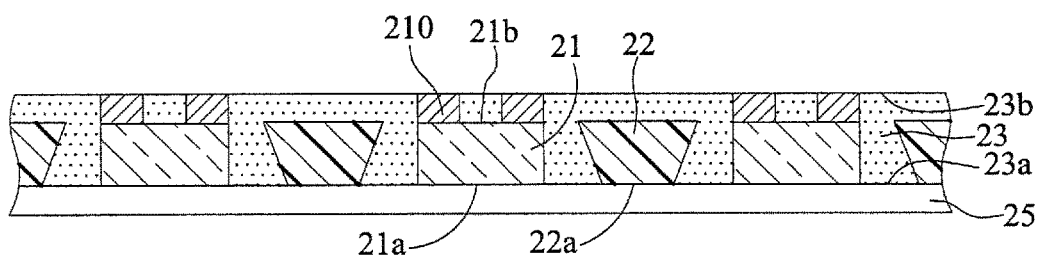

As shown in FIG. 2F, a phosphor layer 25 is formed on the first surface 23a of the encapsulant 23 and the bottom side 22a of the dam 22 and covers the light-emitting side 21a of the light-emitting component 21.

In another embodiment, the material that is used to form the phosphor layer 25 is injected into the trench 230, so as to cover the light-emitting side 21a of the light-emitting component 21 along the trench 230. Also, the phosphor layer 25 in the trench 230 serves as an electrical isolation.

Moreover, the phosphor layer 25 is formed by an electrostatic adsorption process.

Figure 2G:
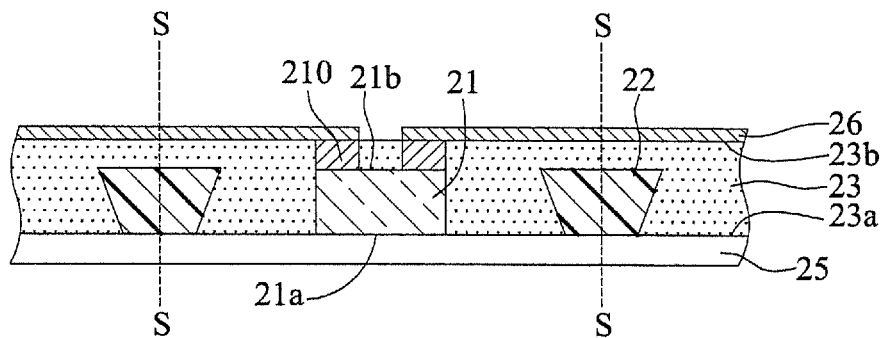
Figure 2G:
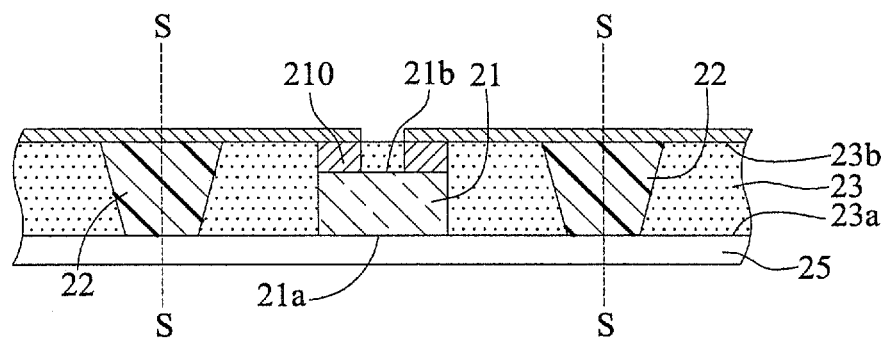

As shown in FIG. 2G, a heat-dissipating member 26 is formed on the second surface 23b of the encapsulant 23.

In an embodiment, the heat-dissipating member 26 is in contact with the electrodes 210 of the light-emitting component 21, and the heat-dissipating member 26 is a metal material, which forms a metal heat dissipation layer by applying, platting, depositing processes.

Moreover, when the dam 22 is exposed from the second surface 23b of the encapsulant 23, the dam 22 has an outer junction side 22b exposed from the second surface 23b of the encapsulant 23, such that the heat-dissipating member 26 contacts the outer junction side 22b, as shown in FIG. 2G'.

Figure 2H:
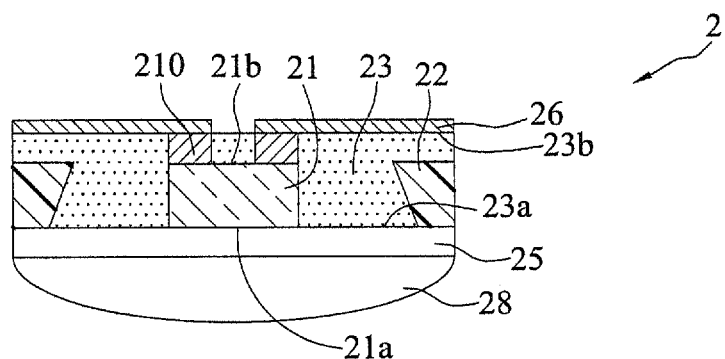

As shown in FIG. 2H, a protection layer (not illustrated) or a transparent layer 28 such as a lens or a silicon-included material is formed on the phosphor layer 25. Then, a plurality of light-emitting package structures 2 are fabricated by performing a cutting operation along the cutting path S as shown in FIG. 2G.

In addition, when both the electrodes 210 of the light-emitting component 21 and the dam 22 are not exposed from the second surface 23b of the encapsulant 23, as shown in FIGS. 3A and 3B, a plurality of openings 330 are formed on the second surface 23b of the encapsulant body 23 to expose the electrodes 210 of the light-emitting component 21 and the outer junction side 22b of the dam 22.

Figure 3C:
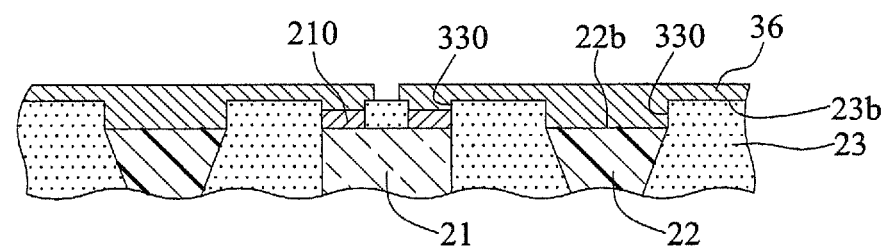

As shown in FIG. 3C, a heat-dissipating member 36 is formed on the second surface 23b of the encapsulant 23 and in the openings 330.

In summary, the electrodes 210 are formed on one side of the light-emitting component 21, and the dam 22 is disposed around the light-emitting component 21 such that the dam 22 is exposed from the first surface 23a of the encapsulant 23. Then the heat produced by the phosphor layer 25 contacts a portion of the bottom side 22a of the dam 22 and is transmitted to a region outside of the package structure through the dam 22, so as to promote the heat-dissipating efficiency and prevent the etiolation of the encapsulant 23, and maintain the emitting efficiency of the phosphor layer 25. Also, the phosphor layer 25 does not encapsulate the light-emitting component 21, to prevent the heat fade issue caused by the heat produced by the light-emitting component 21, thereby promoting the emitting efficiency.

Moreover, since the electrodes 210 of the light-emitting component 21 is in contact with the heat-dissipating member 26, the light-emitting component 21 may also directly dissipate the heat to promote the emitting efficiency.

Further, the outer junction side 22b of the dam 22 also serves as a heat dissipation path.

The above embodiments only exemplarily specify the concept and effect of the invention, but not intend to limit the invention. Any person skilled in the art can perform modifications and adjustments on the above embodiments without departing the spirit and category of the invention.

What is claimed is:

1. A light-emitting package structure, comprising:
an encapsulant having a first surface and a second surface opposing the first surface;
at least one light-emitting component embedded in the encapsulant, the light-emitting component having a light-emitting side exposed from the first surface of the encapsulant and a non-emitting side opposing the light-emitting side and positioned at the same side with the second surface of the encapsulant, the non-emitting side having a plurality of electrodes;
at least one dam embedded in the encapsulant and exposed from the first surface of the encapsulant, wherein the light-emitting side of the light-emitting component is flush with a side of the dam; and
a phosphor layer formed on the first surface of the encapsulant, being in contact with the dam, and covering the light-emitting side of the light-emitting component.

2. The light-emitting package structure of claim 1, wherein the light-emitting component is a light-emitting diode.

3. The light-emitting package structure of claim 1, wherein the electrodes of the light-emitting component are exposed from the second surface of the encapsulant.

4. The light-emitting package structure of claim 1, wherein the electrodes of the light-emitting component are flush with the second surface of the encapsulant.

5. The light-emitting package structure of claim 1, wherein the dam is exposed from the second surface of the encapsulant.

6. The light-emitting package structure of claim 1, wherein the dam has a surface flush with the second surface of the encapsulant.

7. The light-emitting package structure of claim 1, wherein the dam is a circuit board, a lead frame or a conductor.

8. The light-emitting package structure of claim 1, wherein the dam narrows gradually in a direction toward the first surface of the encapsulant, and has a lateral surface as a light-reflecting surface.

9. The light-emitting package structure of claim 1, wherein the encapsulant is made of silicone.

10. The light-emitting package structure of claim 1, wherein the first surface of the encapsulant has a trench formed thereon, and a portion of the phosphor layer is formed in the trench.

11. The light-emitting package structure of claim 1, wherein the phosphor layer has a plurality of phosphor particles that are disposed at one side of the phosphor layer.

12. The light-emitting package structure of claim 1, further comprising a heat-dissipating member disposed on the second surface of the encapsulant.

13. The light-emitting package structure of claim 12, wherein the heat-dissipating member is in contact with the electrodes of the light-emitting component.

14. The light-emitting package structure of claim 1, further comprising a protection layer or a transparent layer formed on the phosphor layer.

* * * * *